(12) United States Patent
Task et al.

(10) Patent No.: US 11,613,805 B2
(45) Date of Patent: Mar. 28, 2023

(54) SYSTEMS AND METHODS FOR OPTIMAL SOURCE MATERIAL DEPOSITION ALONG HOLE EDGES

(71) Applicant: UNITED TECHNOLOGIES CORPORATION, Farmington, CT (US)

(72) Inventors: Michael N. Task, Vernon, CT (US); Russell A. Beers, Manchester, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 0 days.

(21) Appl. No.: 16/786,228

(22) Filed: Feb. 10, 2020

(65) Prior Publication Data

US 2020/0181760 A1  Jun. 11, 2020

Related U.S. Application Data

(62) Division of application No. 14/632,158, filed on Feb. 26, 2015, now Pat. No. 10,557,194.

(51) Int. Cl.
*H01J 37/32* (2006.01)
*C23C 14/32* (2006.01)
(Continued)

(52) U.S. Cl.
CPC .......... *C23C 14/325* (2013.01); *C23C 14/046* (2013.01); *C23C 14/14* (2013.01);
(Continued)

(58) Field of Classification Search
None
See application file for complete search history.

(56) References Cited

U.S. PATENT DOCUMENTS 5,476,691 A    12/1995   Komvopoulos et al.
6,274,492 B1 *  8/2001   Klimes ................. C23C 14/046
                                                              257/E21.584
(Continued)

FOREIGN PATENT DOCUMENTS

EP       0323388 A2      7/1989
JP    2004238719 A       8/2004
JP    2005307288 A   *  11/2005

OTHER PUBLICATIONS

English Translation to JP2004238719 Abstract.
European Search Report for Application No. 16 15 7470; Search Report Date dated Jun. 27, 2016, 6 pages.

*Primary Examiner* — Jason Berman
(74) *Attorney, Agent, or Firm* — Cantor Colburn LLP

(57) ABSTRACT

A method for depositing a coating of a source material onto a panel is disclosed. The method includes providing a cathodic arc, the cathodic arc including a target surface, the target surface disposed along a target deposition axis and able to emit the source material as a generally cloud of source material vapor and a generally conical stream of liquid particles of the source material. The method further includes positioning the panel relative to the target surface based on a deposition angle, the deposition angle being between the target surface and an outer limit of the generally conical stream of liquid particles o the source material. The method may further include emitting the source material from the target surface as the generally conical cloud of source material vapor and coating the edge with the cloud of source material vapor to provide an edge coating.

15 Claims, 7 Drawing Sheets

(51) Int. Cl.
*C23C 14/04* (2006.01)
*F23R 3/00* (2006.01)
*C23C 14/14* (2006.01)

(52) U.S. Cl.
CPC ........ *F23R 3/002* (2013.01); *H01J 37/32055* (2013.01); *H01J 37/32614* (2013.01); *F23M 2900/05004* (2013.01); *F23R 2900/00018* (2013.01); *Y02T 50/60* (2013.01)

(56) References Cited

U.S. PATENT DOCUMENTS

| | | |
|---|---|---|
| 2007/0087211 A1 | 4/2007 | Endres |
| 2008/0160208 A1 | 7/2008 | Maly et al. |
| 2010/0131023 A1 | 5/2010 | Costello et al. |
| 2012/0160664 A1 | 6/2012 | Ivory et al. |
| 2014/0076718 A1* | 3/2014 | Gorokhovsky ... H01J 37/32917 204/192.38 |

* cited by examiner

SYSTEMS AND METHODS FOR OPTIMAL SOURCE MATERIAL DEPOSITION ALONG HOLE EDGES

CROSS REFERENCE TO RELATED APPLICATIONS

This Application is a Divisional Application of U.S. patent application Ser. No. 14/632,158 filed Feb. 26, 2015 which is incorporated by reference herein in its entirety.

TECHNICAL FIELD

The present disclosure relates to coating surfaces with a source material using cathodic arc deposition, and more particularly, to systems and methods for cathodic arc deposition of a source material that coat edges associated with the surface.

BACKGROUND

Processes for coating surfaces of various machine components often employ cathodic arc deposition of a source material onto a surface. Cathodic arc deposition generally refers to physical vapor deposition techniques in which a cathode, composed of the coating source material, is vaporized. The vaporized source material then emits from the cathode and forms a film upon the surface of the machine component. Various materials can be vaporized and used as a coating via cathodic arc deposition, including, but not limited to, metallic, ceramic, and composite materials.

Cathodic arc deposition is often used when a film of a material having thermal resistive properties is desired on an outer layer of a machine component that may be exposed to excess or extreme heat. For example, a layer of such a film of a material having thermal resistive properties may be desired when designing and/or producing combustor panels for a combustor section of a gas turbine engine. Such combustor panels are exposed to intensely hot temperatures when the gas turbine engine is burning fuel in the combustor section. Cathodic arc deposition may provide a convenient method for coating such a panel during production.

However, panels that are coated via cathodic arc deposition often include holes such as, but not limited to, dilution holes. In prior cathodic arc deposition practices, the edges of said holes sometimes have improper coatings, in comparison to the coatings made on the outer surfaces of the panel. Oxidation distress may be present at said edges of the holes because, when using past processes for cathodic arc deposition, the coating on the edges of the holes may have inadequate thickness or extensive porosity. Oxidation along said edges may be harmful to the health and durability of the panel and, in turn, harmful to the health and durability of the machine with which the panel is associated.

Because health and durability of panels associated with machines is imperative in creating a durable product, a need exists for systems and methods for cathodic arc deposition which provide dense coatings of a source material along edges of the panel.

SUMMARY

In accordance with one aspect of the disclosure, a method for depositing a coating of a source material onto a panel, the panel defining an edge and a front panel surface. The method may include providing a cathodic arc, the cathodic arc including a target surface, the target surface disposed along a target deposition axis and able to emit the source material as both a cloud of source material vapor and a generally conical stream of liquid particles of the source material. The method may further include positioning the panel relative to the target surface based on a deposition angle, the deposition angle being between the target surface and an outer limit of the generally conical stream of liquid particles of the source material. The method may further include emitting the source material from the target surface as both the generally conical cloud of source material vapor and the generally conical stream of liquid particles of the source material and coating the edge with the cloud of source material vapor to provide an edge coating.

In a refinement, positioning the panel relative to the target surface based on the deposition angle may include positioning the panel substantially perpendicular to the target deposition axis.

In a refinement, the panel may define at least one hole, the edge may be a hole edge of the at least one hole, and coating the edge with the source material to provide an edge coating includes coating the edge of the at least one hole.

In a further refinement, the target deposition axis defines a target deposition plane and positioning the panel relative to the target surface based on the deposition angle may include positioning the panel such that the at least one hole is disposed above the target deposition plane.

In another further refinement, the target deposition axis defines a target deposition plane and positioning the panel relative to the target surface based on the deposition angle may include positioning the panel such that the at least one hole is disposed below the target deposition plane.

In a refinement, the method may further include coating the front panel surface with the source material to provide a front panel surface coating.

In a further refinement, coating the edge with the source material to provide the edge coating may deposit the edge coating at an edge density, coating the front panel surface with the surface material to provide the front panel surface coating deposits the front panel surface coating at a front panel surface density, and the edge density and the front panel surface density are substantially similar.

In a refinement, emitting the source material from the target surface further includes emitting an oxidation resistant material as the source material.

In a refinement, emitting the source material from the target surface further includes emitting a MCrAIY-type material as the source material.

In a refinement, the method may further include electrically charging the cathodic arc and emitting the source material from the target surface occurs in response to the electrically charging of the cathodic arc.

In a refinement, the method may further include electrically charging the panel such that a negative charge attracts the source material to at least one of the edge and the front panel surface.

In accordance with another aspect of the disclosure, a system for depositing a coating of a source material onto at least one panel is disclosed. The at least one panel may define an edge and a front panel surface. The system may include a cathodic arc including a target surface, the target surface disposed along a target deposition axis, and able to emit the source material as both a cloud of source material vapor and a generally conical stream of liquid particles of the source material. The cloud of source material vapor may be used to coat the edge with the source material to provide an edge coating. The system may further include a coating deposition structure for positioning one or both of the cathodic arc panel, such that the panel is positioned relative to the target surface based on a deposition angle, the deposition angle being between the target surface and an outer limit of the generally conical stream of liquid particles of the source material.

In a refinement, the coating deposition structure may position the panel substantially perpendicular to the target deposition axis.

In a refinement, the panel may define at least one hole, the edge may be a hole edge of the at least one hole, and the edge coating may be a hole edge coating.

In a further refinement, the target deposition axis may define a target deposition plane and positioning the panel relative to the target surface based on the deposition angle may include positioning the panel such that the at least one hole is disposed above the target deposition plane.

In another further refinement, the target deposition axis may define a target deposition plane and positioning the panel relative to the target surface based on the deposition angle may include positioning the panel such that the at least one hole is disposed below the target deposition plane.

In accordance with yet another aspect of the disclosure, a method for depositing a coating of a source material onto a combustor panel of a combustor section n of a gas turbine engine is disclosed. The combustor panel may define a plurality of holes and a front panel surface, each to the plurality of holes including a hole edge. The method may include providing a cathodic arc which includes a target surface, the target surface disposed along a target deposition axis and able to emit the source material as both a cloud of source material vapor and a generally conical stream of liquid particles of the source material. The method may further include positioning the panel relative to the target surface based on a deposition angle, the deposition angle being between the target surface and an outer limit of the generally conical stream of liquid particles of the source material, which is formed when the source material is emitted from the target surface. The method may further include emitting the source material from the target surface as the cloud of source material vapor and the generally conical stream of liquid particles of the source material and coating each hole edge with the cloud of source material vapor to provide hole edge coatings.

In a refinement, positioning the combustor panel relative to the target surface based on the deposition may include positioning the combustor panel substantially perpendicular to the target deposition axis.

In a refinement, the target deposition axis may define a target deposition plane and positioning the combustor panel relative to the target surface based on a deposition angle may include positioning the combustor panel such that the at least one of the plurality of holes is disposed above the target deposition plane.

In a refinement, the target deposition axis may define a target deposition plane and positioning the combustor panel relative to the target surface based on a deposition angle may include positioning the combustor panel such that at least one of the plurality of holes is disposed below the target deposition plane.

These and other aspects and features of the present disclosure will be better understood when read in conjunction with the accompanying drawings.

It should be understood that the drawings are not necessarily to scale and that the disclosed embodiments are sometimes illustrated diagrammatically and in partial views. In certain instances, details which are not necessary for an understanding of this disclosure or which render other details difficult to perceive may have been omitted. It should be understood, of course, that this disclosure is not limited to the particular embodiments illustrated herein.

DETAILED DESCRIPTION

Figure 1:
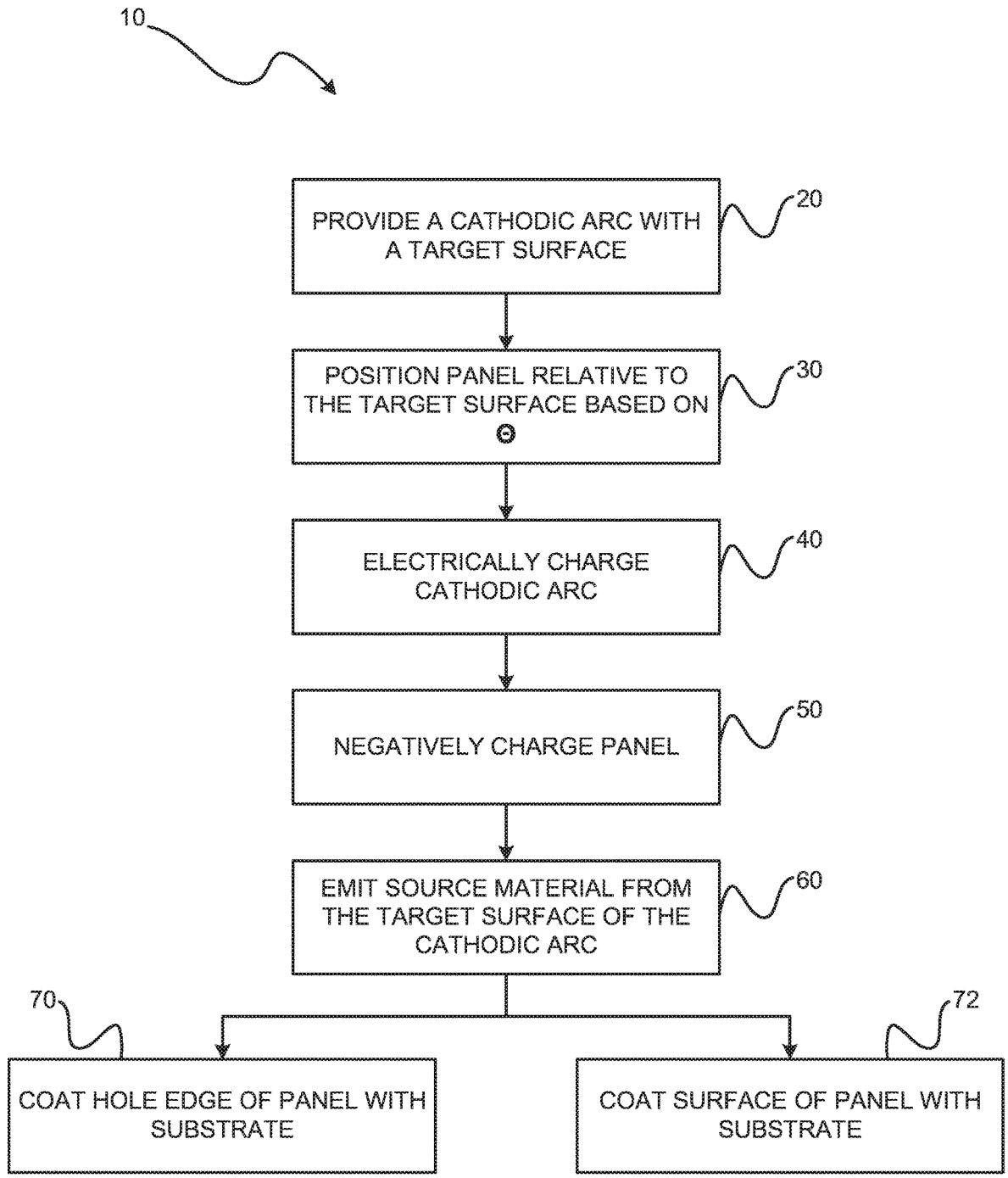
FIG. 1 is a flowchart illustrating a method for depositing a coating of a source material onto a panel, in accordance with an embodiment of the present disclosure.
Figure 2:
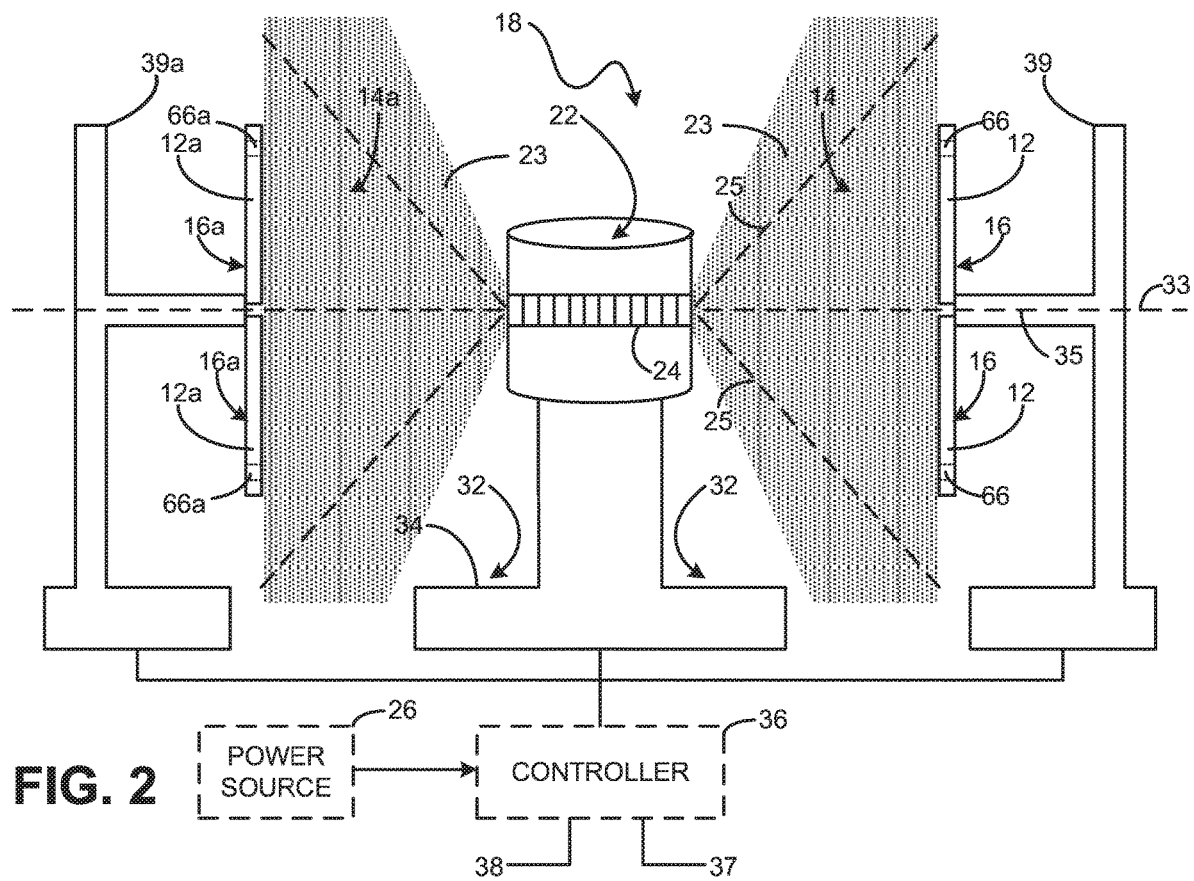
FIG. 2 is a schematic side view of a system for depositing a coating of a source material onto a panel, in accordance with an embodiment of the disclosure and for use in conjunction with the method of FIG. 1.

Referring to the drawings, and with specific reference to FIGS. 1-4, a method 10 for depositing a coating 12 of a source material 14 onto one or more panels 16 is disclosed and illustrated as a flowchart in FIG. 1. The method 10 may be performed by using a system 18, as shown in FIG. 2, for depositing the coating 12 of the source material 14 onto the one or more panels 16. At block 20, a cathodic arc 22 may be provided for use in depositing the coating 12 of the source material 14 onto the one or more panels 16. An example panel 16 is shown in greater detail in FIG. 3. Certain elements of the system 18 are shown in a magnified view in FIG. 4.

The cathodic arc 22 may be any electric arc capable of vaporizing a material to create, project and/or emit the source material 14 on to the one or more panels 16. As shown, the cathodic arc 22 may include one or more target surfaces 24. The target surface(s) 24 may be a highly energized location on the cathodic arc 22, from which materials are vaporized into vapor clouds 23 of source material 14 vapor. The vapor clouds 23 of the source material 14 may be of any shape and may fill any volume within a chamber in which the system 18 is disposed. The vapor clouds 23 may be composed of positive metal ions of the source material. Additionally, the source material 24 may include liquid particles 25 (e.g., droplets) which emit from the target surfaces 24. The liquid particles 25 may emit in a generally conical shape and may be directed in the direction of the one or more panels 16.

The source material 14 may be, for example, an oxidation resistive source material used for preventing damage to machine components when faced with excess or extreme temperatures. An example of such an oxidation resistive source material is a MCrAlY-type material. MCrAlY-type materials are oxidation and corrosion resistant materials that may be applied to hot machine components, such as gas turbine engine components. MCrAlY-type coatings are generally known in the art and may include one or more metals ("M") such as Nickel (Ni), Cobalt (Co), Iron (Fe), or any mixtures thereof. Further, a MCrAlY-type material may include any combination or mixture of Platinum Group Metals (PGM), refractories, and/or other generally reactive elements, such as Hafnium (Hf), Zirconium (Zr), Silicon (Si), Lanthanum (La), and the like. Power for, generally, charging the cathodic arc 22 and, more specifically, for charging the target surfaces 24 may be provided by a power source 26.

Figure 3:
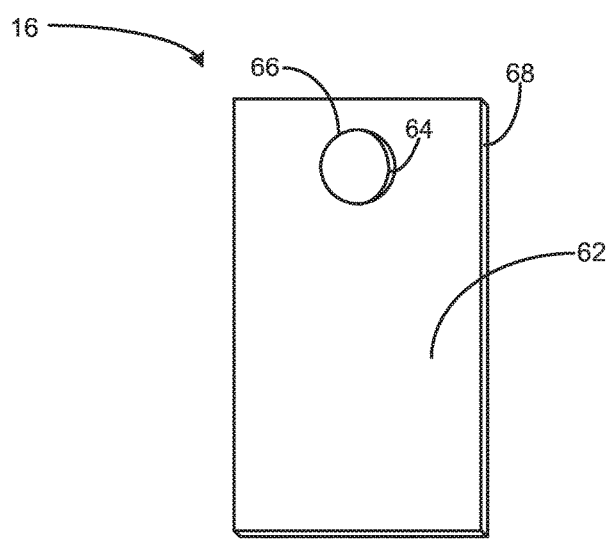
FIG. 3 is a perspective view of a panel, in association with the embodiments of FIGS. 1 and 2.
Figure 4:
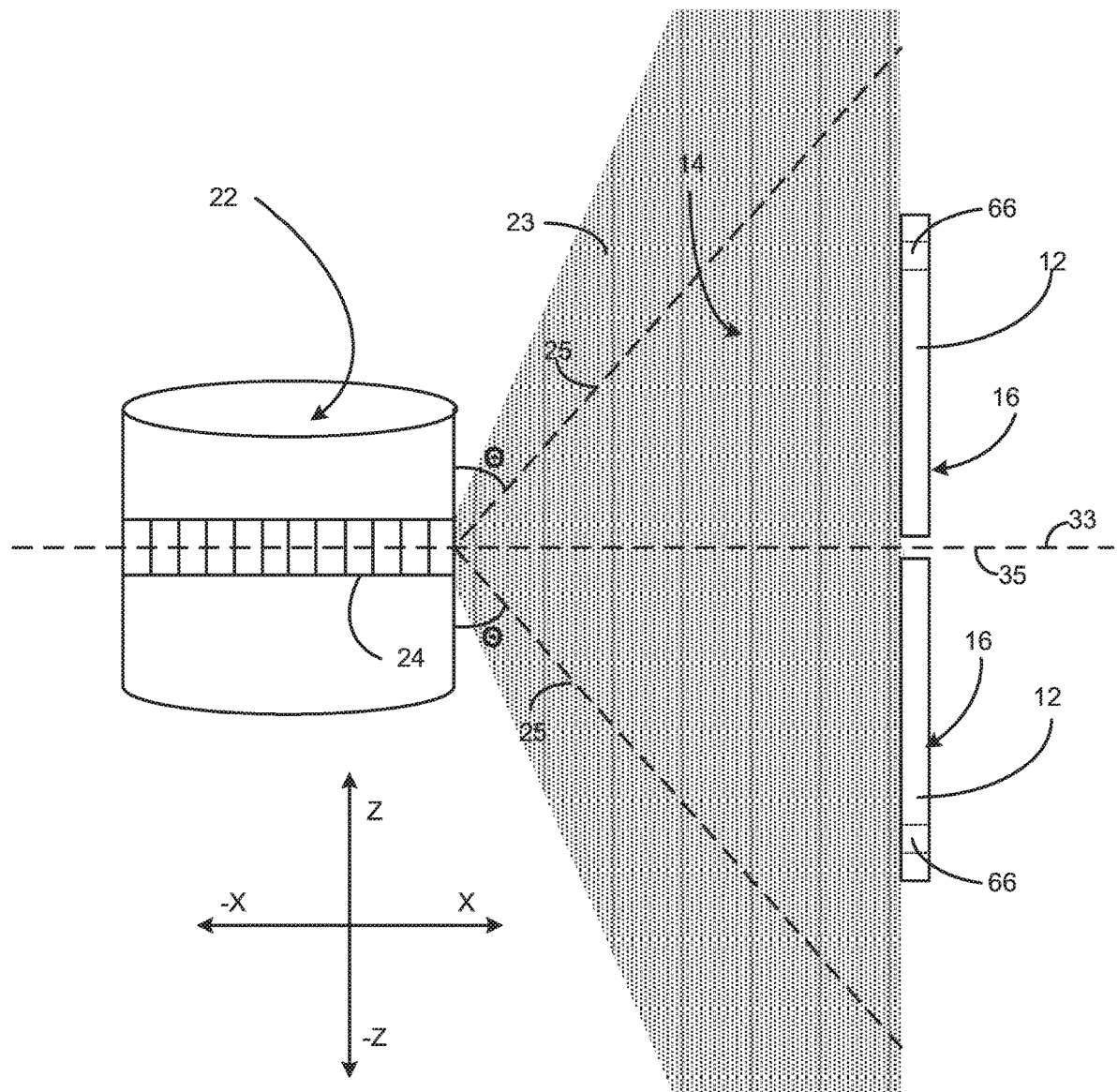
FIG. 4 is a magnified view of elements of the system for depositing a coating of a source material onto a panel of FIG. 2, in accordance with the embodiment of FIGS. 1 and 2.

Returning now to the method 10 of FIG. 1, but with continued reference to FIGS. 2-4, the one or more panels 16 may be positioned based on a deposition angle Θ (as shown in FIG. 4). The deposition angle Θ may be determined as the angle between at least one target surface 24 (as shown disposed along a target deposition axis 33) and the bounds of the generally conical stream of liquid droplet particles, emitted from the target surface, with respect to one of the target surfaces 24 of the cathodic arc 22, as shown in block 30. In some examples, the desired positioning with respect to the angle Θ may be achieved by positioning the one or more panels 16 substantially perpendicular to the target deposition axis 33. The target deposition axis 33 may define a target deposition plane 35, about which the positioning may further be configured. For example, the one or more panels 16 may be positioned such that one or more holes 66 of the panel are disposed above the target deposition plane 35. Additionally, or alternatively, the one or more panels 16 may be positioned such that one or more holes 66 of the panel are disposed below the target deposition plane 35.

Positioning of the one or more panels 16 may be realized using a coating deposition structure 32. The coating deposition structure 32 may include a cathodic arc positioning member 34 which may position the cathodic arc 22 and/or otherwise hold the cathodic arc 22 in place with respect to the one or more panels 16. For further positioning the one or more panels 16, for example, perpendicularly with respect to a target surface 24 of the cathodic arc 22, the coating deposition structure 32 may further include a panel positioning member 39. In some examples, the positioning of the coating deposition structure 32 and its respective members 34, 39 may be controlled by a controller 36. For example, the controller 36 may send signals to one or more actuators associated with the coating deposition structure 32 and the actuators may be used to align the one or more panels 16 and/or the cathodic arc 22 perpendicularly. Controls for positioning may be determined by one or both of user input 37 and automatic control instructions 38. Of course, the controller 36 and the associated control elements may be omitted from the system 18 and positioning of the cathodic arc 22, the one or more panels 16, and the associated coating deposition structure 32 may be performed manually.

Using the power source 26, the cathodic arc 22 may be electrically charged, as shown in block 40. In some examples, the controller 36 may be used to control the magnitude of electric charge transmitted to the cathodic arc 22; however, the magnitude of electric charge may also be controlled manually. As shown in block 50, the method 10 may include negatively biasing the one or more panels 16 with negative ions by using, for example, the power source 26, so that the one or more panels 16 is negatively charged such that the source material 14 is attracted to the one or more panels 16. Such negative biasing may provide a more receptive surface for the source material 14 to form the coating 12, when the positively charged vapor cloud 23 of the source material 14 are attracted to surfaces of the one or more panels 16.

As described above, the cathodic arc 22 is capable of emitting the source material 14, as the vapor cloud 23 and the liquid particles 25, from the target surface 24. At block 60, the method 10 includes emitting the source material 14 from the target surface 24. Upon emission, the source material 14 may come in contact with the one or more panels 16; upon contact, the vapor may condense into the coating 12, which thereby coats a front surface 62 of the panel 16 (block 70) and coats an edge 64 of a hole 66 of the one or more panels 16 (block 72).

Because the panel 16 is positioned based on the deposition angle Θ with respect to the target surface 24, the coating 12 may have optimal density and microstructure throughout all surfaces of the panel 15 (e.g., the front surface 62, the edge 64 of the hole 66, and the edge 68 of the panel 16 shown in FIG. 3). Because the edges 64, 68 may not be exposed to direct contact from the liquid particles 25, the edges 64, 68 may avoid being coated with an uneven microstructure. By coating the edges 64, 68 by primarily exposing said edges 64, 68 to the vapor cloud 23, a non-porous microstructure having consistent density may be achieved throughout all surfaces. By being positioned as such, the edge 64 of the hole 66 may be presented with a greater portion of the cloud 23 of source material 14, in comparison to other positioning schemes. As such, the coating 12 at the front surface 62 and the coating 12 at the edge 64 of the hole 66 and/or at the edge 68 may have substantially similar density and/or microstructure.

Returning now to FIG. 2, certain embodiments of the system 18 may include requisite elements to coat more than one panel. For example, FIG. 2 shows a second set of panels 16a, which may be coated with a coating 12a by a source material 14a that is emitted by the cathodic arc 22 from the target surface 24 of the cathodic arc 22. To position the second set of panels 16a perpendicularly with respect to the target surface 24, the coating deposition structure 32 may further include a second panel positioning member 39a. Of course, any number of panels 16 may be coated simultaneously or in succession using one or both of the system 18 and the method 10 of above described embodiments.

INDUSTRIAL APPLICABILITY

From the foregoing, it can be seen that the technology disclosed herein has industrial applicability in a variety of settings such as, but not limited to, systems and methods for coating a panel with a source material using a cathodic arc. By positioning panels in accordance with the systems and methods described above, the coatings applied thereto may have a consistent microstructure and avoid loose, columnar microstructures. Specifically, by positioning a panel based on a defined deposition angle with respect to the arc, edges of holes that are defined by the structure of the panel may be coated with a desired thickness and density of the source material coating. This is a vast improvement over prior methods, wherein improper coating along hole edges causes oxidation distress at said edges. The disclosed systems and methods may prevent such oxidation distress and, therefore, provide greater health and durability for the panel and any machine with which the panel is associated.

Figure 5:
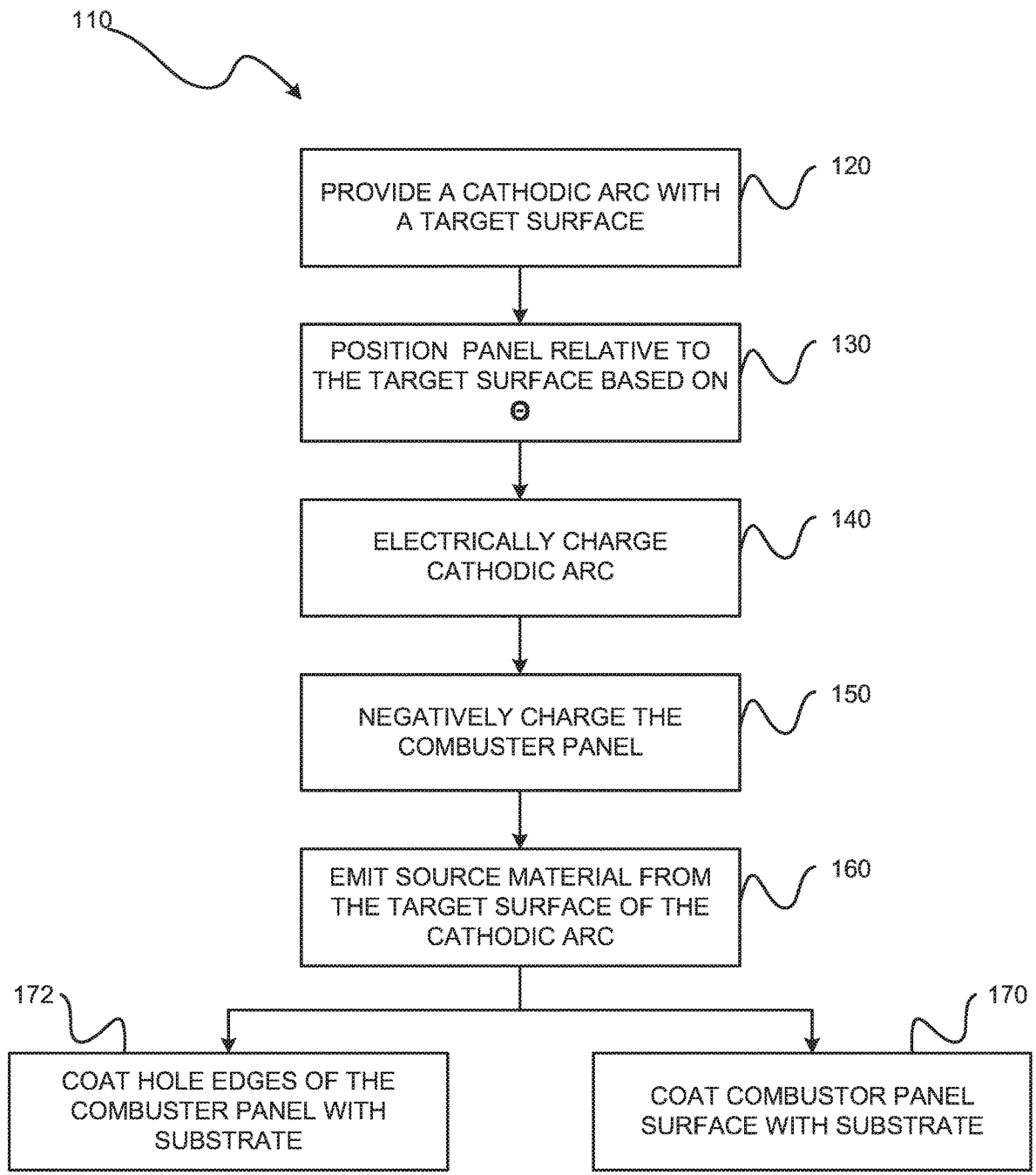
FIG. 5 is a flowchart illustrating a method for depositing a coating of a thermal source material onto a combustor panel of a gas turbine engine, in accordance with an embodiment of the present disclosure.

For example, the disclosed systems and methods may be useful when coating a combustor panel of a combustor section of a gas turbine engine with a thermal resistive source material. FIG. 5 illustrates a flowchart for a method 110 for coating a combustor panel of a combustor section of a gas turbine engine 210 with a thermal resistive source material. The method 110 may include similar elements to those of the method 10 as described above; as such, 100 series numbering is used with respect to the steps of the method 110. Further, such steps may be performed using a system for coating a panel, such as the system 18 illustrated in FIG. 2 and described in detail above.

Figure 6:
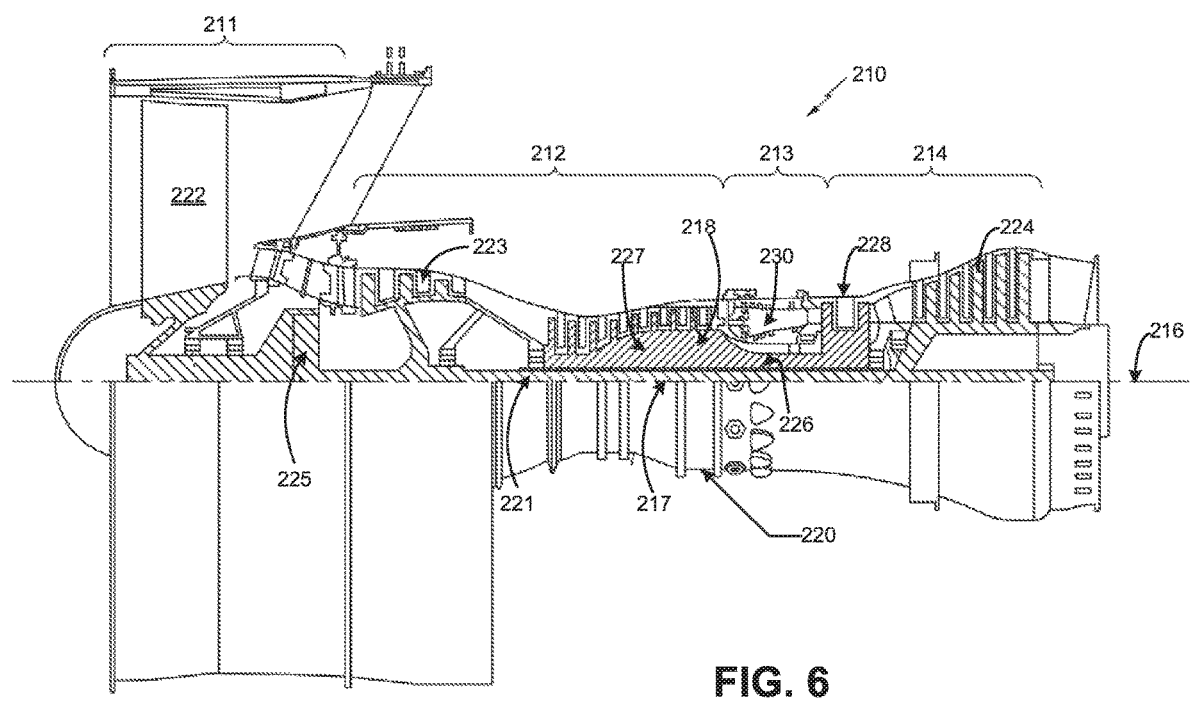
FIG. 6 is a side, cross-sectional view of a gas turbine engine, with which a combustor panel coated according to the method of FIG. 4 may be associated.

Turning now to FIG. 6, the gas turbine engine 210 may have a fan section 211, the fan section 211 drawing in ambient air and directing the ambient air to a compressor section 212. The incoming air is greatly compressed by the compressor section 212 and directed to a combustor section 213 where it is mixed with fuel and combusted. The products of that combustion, in the form of very hot and expanding gases, are directed to a turbine section 214 shown to be downstream of the combustor section 213. The turbine section 214 and/or compressor section 212 may each be comprised of a plurality of blades radially extending from a shaft forming rotating sections or rotors. A plurality of vanes may radially extend inwardly from a static section or stator, and are intermeshed with the plurality of blades. In so doing, it can be seen that the turbine section 214, compressor section 212, and fan section 211 all revolve around a central engine axis 216.

Further, the gas turbine engine 210 may include a low spool 217 and a high spool 218 mounted for rotation about the central engine axis 216 relative to an engine case structure 220. The low spool 217 may include an inner shaft 221 that interconnects to a fan 222, a low pressure compressor 223 ("LPC") and a low pressure turbine 224 ("LPT"). The inner shaft 221 may drive the fan 222 directly or through a geared architecture 225 to drive the fan at a lower speed than the low spool 217. The high spool 218 may include an outer shaft 226 that interconnects a high pressure compressor 227 ("HPC") and high pressure turbine ("HPT") 228. A combustor 230 is arranged between the HPC 227 and the HPT 228. The inner shaft 221 and the outer shaft may be concentric and rotate about the central engine axis 216 which is collinear with their respective longitudinal axes.

Air within the gas turbine engine 210 may be compressed by the LPC 223 and/or the HPC 227. Said air may then be mixed with fuel and burned within the combustor 230 and then may be expanded throughout the HPT 228 and/or the LPT 224. The LPT 224 and/or the HPT 228 may rotationally drive the low spool 217 and the high spool 218, respectively, in response to the expansion of the fuel/air mixture.

Figure 7:
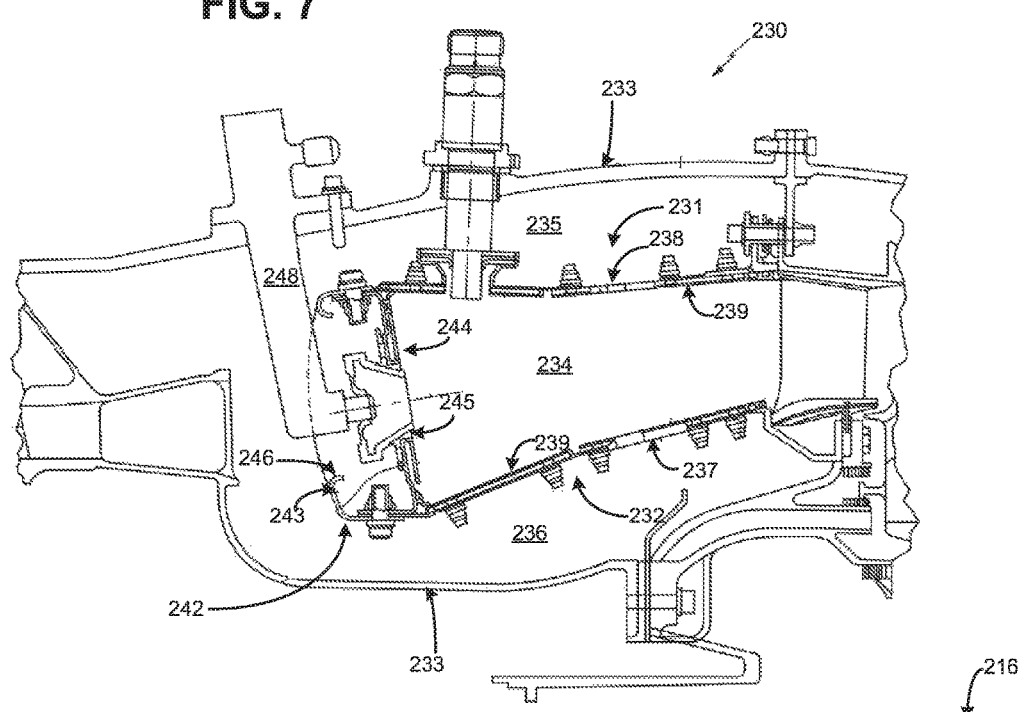
FIG. 7 is a side, cross-sectional view of a combustor section of the gas turbine engine of FIG. 5, including one or more combustor panels coated according to the method of FIG. 4.

Returning to the combustor 230, FIG. 7 illustrates an example combustor 230 which, generally, may include an outer liner 231, an inner liner 232, and one or more combustor panels 233, the one or more combustor panels 233 defining a circumferential enclosure. The outer liner 231 and the inner liner 232 may be spaced apart such that a combustion chamber 234 may be defined therein. In some examples, the combustion chamber 234 is, generally, shaped annularly. The outer liner 231 may be spaced radially inward from an outer portion one or more combustor panels 233 to define an annular outer plenum 235. Further, the inner liner 232 may be spaced radially outward from an inner portion of the one or more combustor panels 233, defining an annular inner plenum 236.

The outer liner 231 and the inner liner 232 may contain the products of combustion mixture which may be directed downstream toward the turbine section 214. To protect the combustor from effects of the hot, gaseous, combustion mixture, the outer liner 231 and inner liner 232 may include, respectively, an outer support shell 238 and an inner support shell 237, both of which may support a plurality of heat shields 239 attached to a hot side of the outer support shell 238 and/or the inner support shell 237. The heat shields 239 may be attached with fasteners such as, but not limited to, studs and/or nuts.

The combustor may also include a forward assembly 242 immediately downstream of the compressor section 212 to guide compressed airflow to the combustor 230. The forward assembly may include an annular hood 243, a bulkhead assembly 244, and a plurality of swirlers 245. The annular hood 243 may extend radially between the forward ends of the inner liner 232 and the outer liner 231. A plurality of circumferentially distributed hood ports 246 may accommodate a respective plurality of fuel injectors 248 and the hood ports 246 may direct compressed air into the forward end of the combustion chamber 234 through an associated swirler 245. Each swirler 245 may be circumferentially aligned with its respective hood port 246 to project through the bulkhead assembly 244.

The forward assembly 242, the inner liner 232, and the outer liner 231 may introduce core combustion air into the forward end of the combustion chamber 234 while the remainder of the combustion air enters the annular outer plenum 235 and the annular inner plenum 236. The plurality of fuel injectors 248 and the plurality of swirlers 245 may facilitate the generation of a blended fuel-air mixture that supports combustion in the combustion chamber 234. Created combustion gases may flow downstream to the turbine section 214 of the gas turbine engine 210.

Figure 8:
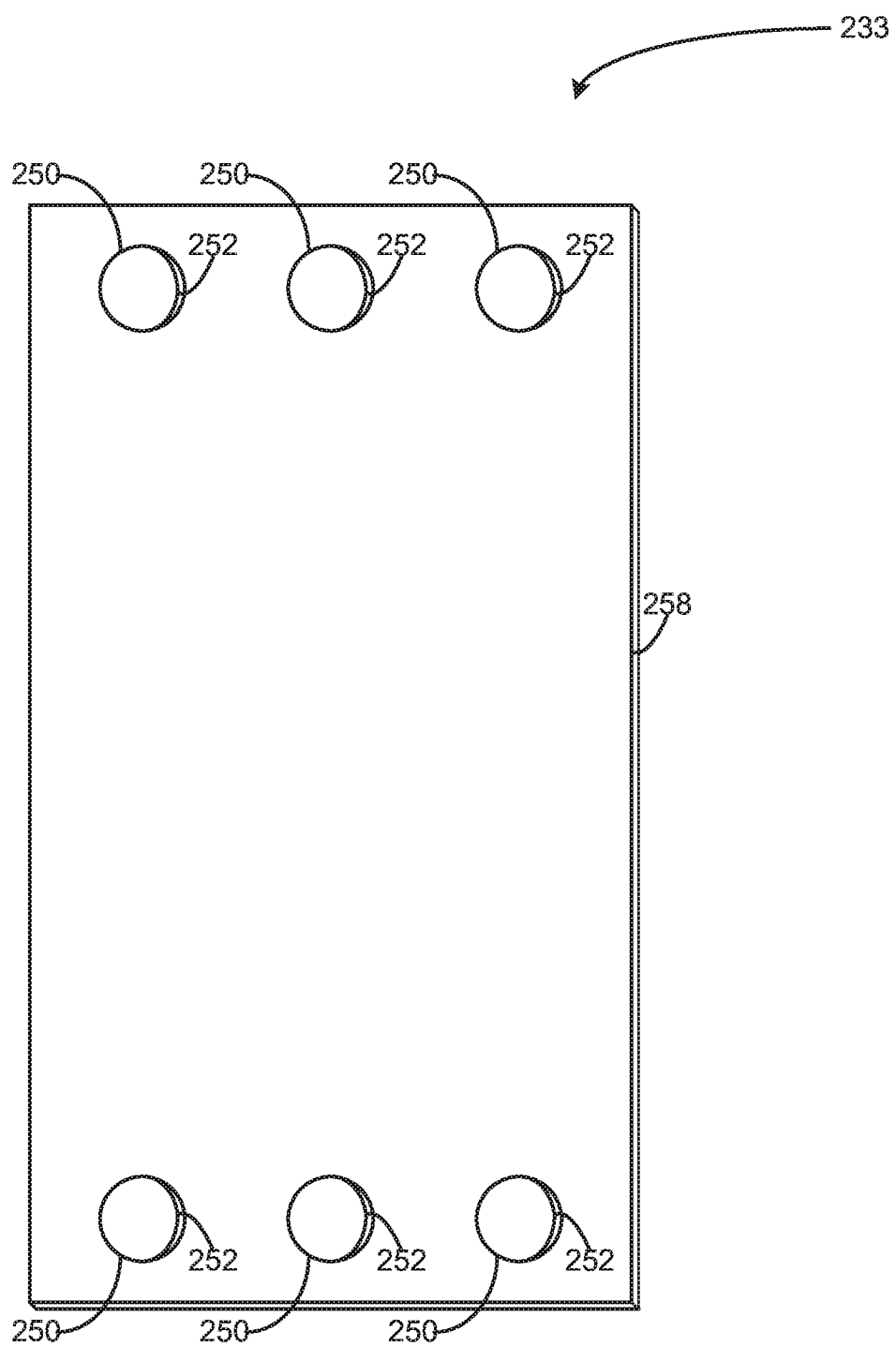
FIG. 8 is a perspective view of a combustor panel, which may be included in the combustor section of FIG. 6 and may be coated with a thermal source material according to the method of FIG. 4.

Because the ignition of fuel within the combustor 230 causes great heat, the one or more combustor panels 233, as illustrated further in FIG. 8, may include a plurality of dissipation holes 250 which may function as exhaust and/or allow air to enter/exit the combustor 230. As with the one or more panels 16 described with reference to FIGS. 1-4, the one or more combustor panels 233 have hole edges 252 which may be susceptible to oxidation distress. Therefore, the method 110 for coating the panel is useful in preventing such oxidation distress by providing a coating at the hole edges 252, the coating having adequate density for preventing oxidation distress.

As such, the method 110 of FIG. 5 may be used to coat the one or more combustor panels with a source material, such as an oxidation resistant material. The method 110 may be performed in conjunction with a system for cathodic arc deposition, such as the system 18 of FIG. 2. The method 110 may begin at block 120, wherein a cathodic arc is provided, the cathodic arc may be similar to the cathodic arc 22 of FIG. 2, having one or more target surfaces 24.

Continuing to block 130, the one or more combustor panels 233 may be positioned based on a deposition angle Θ (as shown in FIG. 4). The deposition angleΘ may be determined as the angle between at least one target surface 24 (as shown disposed along a target deposition axis 33) and the outer limit 31 of the generally conical cloud of source material 14 vapor with respect to one of the target surfaces 24 of the cathodic arc 22. In some examples, the desired positioning with respect to the angle Θ may be achieved by positioning the one or more combustor panels 233 substantially perpendicular to the target deposition axis 33. The target deposition axis 33 may define a target deposition plane 35, about which the positioning may further be configured. For example, the one or more combustor panels 233 may be positioned such that one or more holes 250 of the panel are disposed above the target deposition plane 35. Additionally, or alternatively, the one or more panels 16 may be positioned such that one or more holes 250 of the panel are disposed below the target deposition plane 35.

The cathodic arc may be electrically charged, as shown in block 140. In some examples, the one or more combustor panels 233 may be negatively charged so that the source material may be attracted to the surfaces of the combustor panel, as shown in block 150. Further, the thermal source material may emit from the one or more target surfaces of the cathodic arc, as shown in block 160. Upon emission, the thermal source material may coat the one or more combustor panels 233 (block 170) and/or coat the hole edges 252 of the one or more combustor panels 233 (block 172). By employing the method 110, the hole edges 252 may have a coating of thermal source material having adequate thickness for preventing oxidation distress and, generally, improve the health and durability of the one or more combustor panels 233.

While the present disclosure has been in reference to a gas turbine engine and an aircraft, one skilled in the art will understand that the teachings herein can be used in other applications as well. It is therefore intended that the scope of the invention not be limited by the embodiments presented herein as the best mode for carrying out the invention, but that the invention will include all equivalents falling within the spirit and scope of the claims as well.

What is claimed is:

1. A system for depositing a coating of a source material onto at least one panel, the at least one panel defining an edge and a front panel surface, the system comprising:
    a cathodic arc including a target surface, the target surface disposed along a target deposition axis, and able to emit the source material as both a cloud of source material vapor and a generally conical stream of liquid particles of the source material, the cloud of source material vapor used to coat the edge with the source material to provide an edge coating; and
    a coating deposition structure, the coating deposition structure configured and dimensioned to position one or both of the cathodic arc and the panel, such that the panel is positioned relative to the target surface based on a deposition plane, the deposition plane being defined by the target deposition axis, wherein the entire panel is positioned and maintained above or below the deposition plane and within the generally conical stream of liquid particles; and
    a cathodic arc positioning member, the cathodic arc positioning member configured and dimensioned to position the cathodic arc, such that the panel is positioned relative to the target surface based on the deposition plane and the entire panel is positioned and maintained above or below the deposition plane and within the generally conical stream of liquid particles.

2. The system of claim 1, wherein the coating deposition structure is configured and dimensioned to position the panel substantially perpendicular to the target deposition axis.

3. The system of claim 1, wherein the panel defines at least one hole, the edge is a hole edge of the at least one hole, and the edge coating is a hole edge coating.

4. The system of claim 1, further comprising a controller, the controller configured to send signals to an actuator to align one or both of the cathodic arc and the panel.

5. The system of claim 1, wherein the coating deposition structure further comprises a panel positioning member, the panel positioning member configured and dimensioned to position the panel, such that the panel is positioned relative to the target surface based on the deposition plane.

6. A system for depositing a coating of a source material onto at least one panel, the at least one panel defining an edge and a front panel surface, the system comprising:
    a cathodic arc including a target surface, the target surface disposed along a target deposition axis and the target deposition axis defines a deposition plane, and able to emit the source material as both a cloud of source material vapor and a generally conical stream of liquid particles of the source material, the cloud of source material vapor used to coat the edge with the source material to provide an edge coating; and
    a coating deposition structure, the coating deposition structure configured and dimensioned to position one or both of the cathodic arc and the panel, such that the panel is positioned relative to the target surface based on a deposition angle, the deposition angle being between the target surface and an outer limit of the generally conical stream of liquid particles of the source material; and
    a cathodic arc positioning member, the cathodic arc positioning member configured and dimensioned to position the cathodic arc, such that the panel is positioned relative to the target surface based on the deposition angle and the entire panel is positioned and maintained above or below the deposition plane and within the generally conical stream of liquid particles.

7. The system of claim 6, wherein the coating deposition structure is configured and dimensioned to position the panel substantially perpendicular to the target deposition axis.

8. The system of claim 6, wherein the panel defines at least one hole, the edge is a hole edge of the at least one hole, and the edge coating is a hole edge coating.

9. The system of claim 6, further comprising a controller, the controller configured to send signals to an actuator to align one or both of the cathodic arc and the panel.

10. The system of claim 6, wherein the coating deposition structure further comprises a panel positioning member, the panel positioning member configured and dimensioned to position the panel, such that the panel is positioned relative to the target surface based on the deposition angle.

11. A deposition system comprising:
    a cathodic arc including a target surface, the target surface disposed along a target deposition axis and the target deposition axis defines a deposition plane;
    a coating deposition structure; and
    a panel defining an edge and a front panel surface;
    wherein the cathodic arc is configured and dimensioned to emit a source material as both a cloud of source material vapor and a generally conical stream of liquid particles of the source material, the cloud of source material vapor used to coat the edge with the source material to provide an edge coating;
    wherein the coating deposition structure is configured and dimensioned to position one or both of the cathodic arc and the panel, such that the panel is positioned relative to the target surface based on a deposition angle, the deposition angle being between the target surface and an outer limit of the generally conical stream of liquid particles of the source material; and
    wherein the coating deposition structure further comprises a cathodic arc positioning member, the cathodic arc positioning member configured and dimensioned to position the cathodic arc, such that the panel is positioned relative to the target surface based on the deposition angle and the entire panel is positioned and maintained above or below the deposition plane and within the generally conical stream of liquid particles.

12. The system of claim 11, wherein the coating deposition structure is configured and dimensioned to position the panel substantially perpendicular to the target deposition axis.

13. The system of claim 11, wherein the panel defines at least one hole, the edge is a hole edge of the at least one hole, and the edge coating is a hole edge coating.

14. The system of claim 11, further comprising a controller, the controller configured to send signals to an actuator to align one or both of the cathodic arc and the panel.

15. The system of claim 11, wherein the coating deposition structure further comprises a panel positioning member, the panel positioning member configured and dimensioned to position the panel, such that the panel is positioned relative to the target surface based on the deposition angle.

* * * * *